United States Patent [19]

Nakai

[11] Patent Number: 5,197,028

[45] Date of Patent: Mar. 23, 1993

[54] SEMICONDUCTOR MEMORY DEVICE WITH DUAL REFERENCE ELEMENTS

[75] Inventor: Hiroto Nakai, Kawasaki, Japan

[73] Assignee: Kabushiki Kaisha Toshiba, Kawasaki, Japan

[21] Appl. No.: 568,034

[22] Filed: Aug. 16, 1990

[30] Foreign Application Priority Data

Aug. 18, 1989 [JP] Japan .................................. 1-212177

[51] Int. Cl.[5] .......................................... G11C 11/34
[52] U.S. Cl. .................................. 365/185; 365/104; 365/190; 365/194; 365/208; 365/210; 307/296.8; 307/449
[58] Field of Search ............................. 307/296.8, 449; 365/104, 185, 208, 210, 190, 194

[56] References Cited

U.S. PATENT DOCUMENTS

| 4,223,394 | 9/1980 | Pathak et al. ...................... 365/210 |
| 4,467,457 | 8/1984 | Iwahashi et al. ................... 365/228 |
| 4,611,301 | 9/1986 | Iwahashi et al. ................... 365/207 |
| 4,868,790 | 9/1989 | Wilmoth et al. .................... 365/210 |
| 4,884,241 | 11/1989 | Tanaka et al. ..................... 365/210 |
| 4,967,394 | 10/1990 | Minagawa et al. ................. 365/104 |

Primary Examiner—Joseph E. Clawson, Jr.
Attorney, Agent, or Firm—Foley & Lardner

[57] ABSTRACT

The invention involves a semiconductor memory device having a memory cell with a drain, a gate and a source. The gate of the memory cell is supplied with a first potential for reading a memory cell data. A first reference line is connected to the drain of a first reference cell to receive a first reference cell data. A second reference cell has a drain, a gate and a source. A second reference line is connected to the drain of the second reference cell for receiving a second reference cell data. A gate voltage generating circuit having an output node is connected to the gate of the first reference cell for controlling the gate potential of the first reference cell so that the potentials at the first and second reference lines have the same power source voltage dependancy. A data detecting circuit reads the memory cell data in accordance with the comparison result between the potentials.

8 Claims, 11 Drawing Sheets

SEMICONDUCTOR MEMORY DEVICE WITH DUAL REFERENCE ELEMENTS

FIELD OF THE INVENTION

The present invention relates to a non-volatile semiconductor memory device.

BACKGROUND OF THE INVENTION

Figure 1:
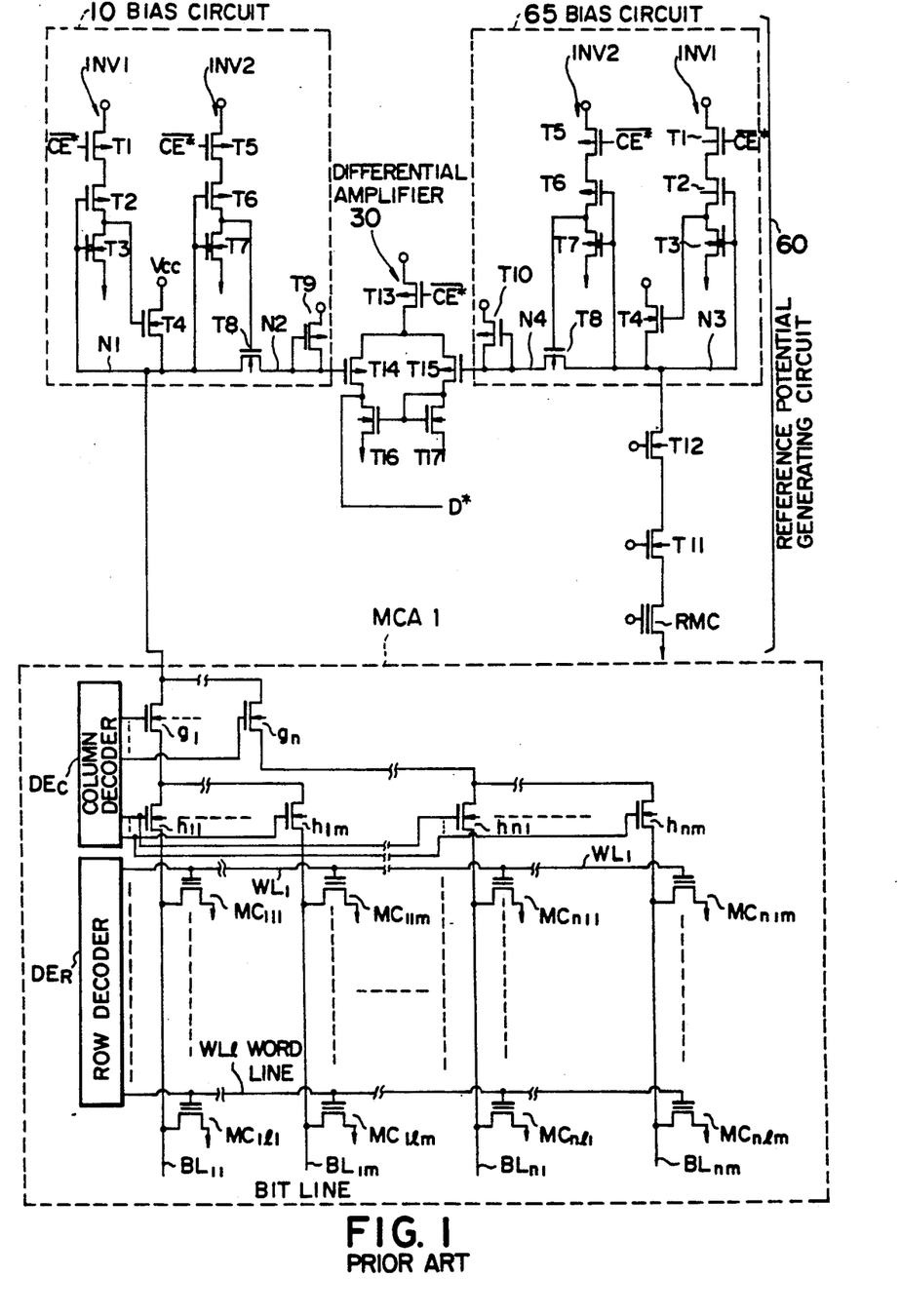
FIGS. 1 and 1A are circuit diagrams showing semiconductor memory devices according to the background art.

As non-volatile semiconductor memory devices, there an EPROM which stores "0" data or "1" data into memory cell by injecting or not injecting electrons into a floating gate. The threshold voltage of a data-written memory cell wherein the electrons are injected is higher than that of a data-erased memory cell which is erased by ultraviolet light. Namely, the data "0" or "1" stored in a memory cell is read by checking whether a current flows through the memory cell when the drain of the memory cell is biased to a predetermined potential. An EPROM of CMOS structure according to the background art is shown in FIG. 1. In FIG. 1, a memory cell array $MCA_1$ has $n \times 1 \times m$ memory cells. Each memory cell $MC_{ijk}$ ($i=1, \ldots, n$, $j=1, \ldots, 1$, $k=1, \ldots, m$) has a drain connected to a bit line $BL_{ik}$, a source connected to a ground line, and a control gate connected to a word line $WL_j$. Each of $n \times m$ bit lines $BL_{ik}$ is connected via column gate transistors $h_{ik}$ and $g_i$ to a node N1 of a bias circuit 10. One of word lines $WL_j$ ($j=1, \ldots, 1$) corresponding to a row address is selectively driven by a row decoder $DE_R$. A pair of column gate transistors $h_{ik}$ and $g_i$ corresponding to a column address is seleCtively driven by a column decoder $DE_C$.

Accordingly, a memory cell $MC_{111}$ for example is accessed by selecting the column gate transistors $g_1$ and $h_{11}$ and the word line $WL_1$.

Figure 1A:
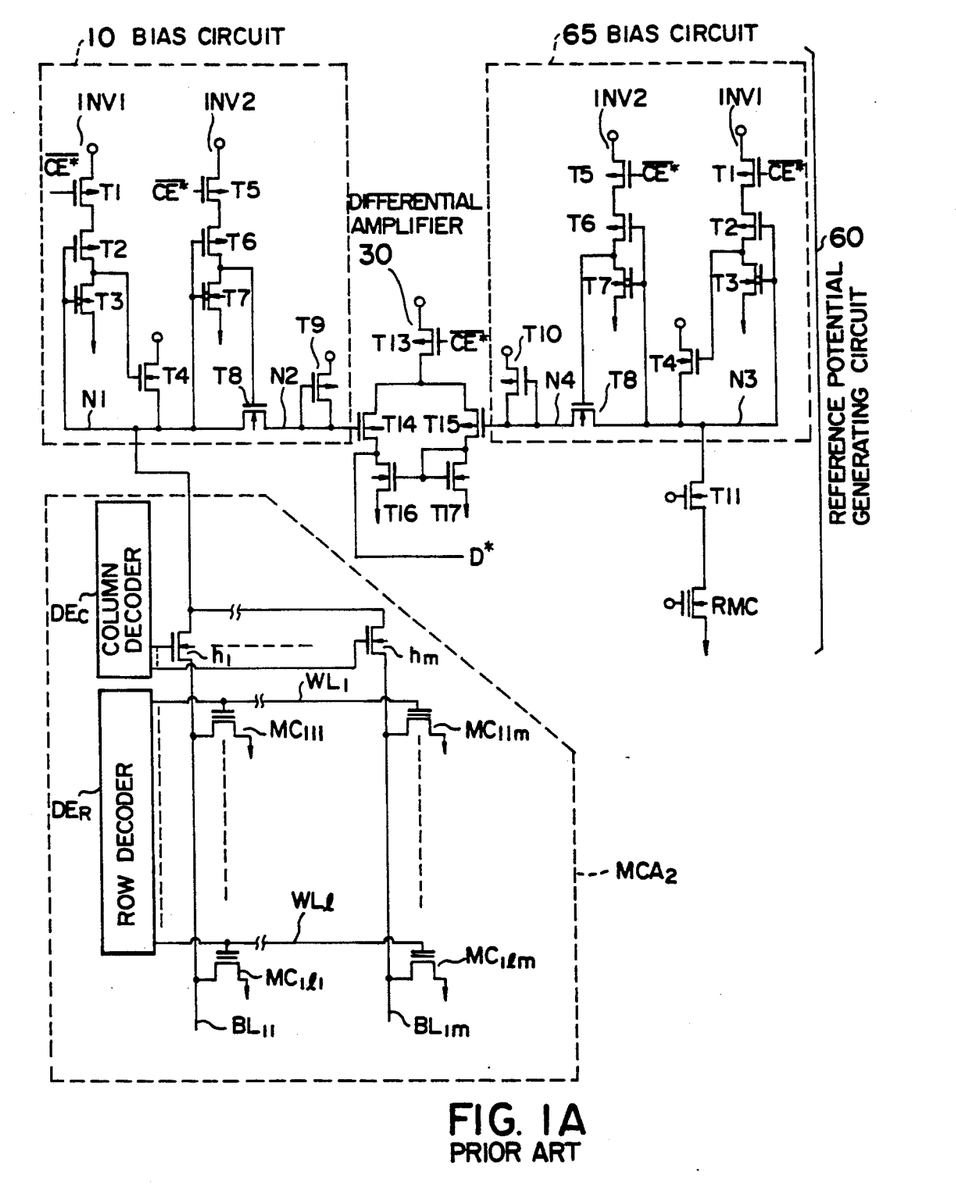

FIG. 1A shows a device having a memory cell array $MCA_2$ which has no column gate transistor $g_i$. The other arrangement is the same as that shown in FIG. 1.

A bias circuit 10 has inverters INV1 and INV2, N-channel transistors T4 and T8, and a P-channel load transistor T9. This circuit 10 supplies a bias potential to the bit line $BL_{ik}$ to which the drain electrode of a selected memory cell $MC_{ijk}$ is connected. The potential at the output terminal (node N2) of the bias circuit 10 changes in accordance with the data stored in a selected memory cell $MC_{ijk}$.

When the "0" data is stored in the selected memory cell, the potential of the node N2 is a high level. On the other hand, when the "1" data is stored in the selected memory cell, the potential of the node N2 is a low level. It is possible to achieve a fast data read from a memory cell $MC_{ij}$ by quickly charging the bit line $BL_{ik}$ from 0 V to a first predetermined voltage. To quickly charge the bit line $bl_{ik}$, the transistor T4 is connected between the node N1 and the power source (whose voltage value is Vcc). The first predetermined voltage is equal to the voltage of the bit line $BL_{ik}$ connected to a selected memory cell $MC_{ijk}$ when the memory cell $MC_{ijk}$ is data-erased memory cell.

The gate electrode of the transistor T4 is connected to the output terminal of the inverter INV1 having P-channel transistors T1 and T2 and an N-channel transistor T3 whose threshold voltage is near 0 V. A chip control signal $\overline{CE}^*$ is applied to the gate electrode of the transistor T1. This chip control signal $\overline{CE}^*$ is 0 V when the semiconductor memory chip is selected, and is the power source voltage Vcc (=5 V) when not selected. The gate electrodes of the transistors T2 and T3 are connected to the node N1. The output of the inverter INV1 is set such that the transistor T4 is made conductive when the potential at the node N1 is equal to or lower than the first predetermined voltage, and made non-conductive when it exceeds the first predetermined voltage.

The node N1 is coupled via the N-channel transistor T8 to node N2. The gate electrode of the transistor T8 is connected to the output terminal of the inverter INV2 having P-channel transistors T5 and T6 and an N-channel transistor T7 whose threshold voltage is near 0 V. Similarly to the transistor T1, the chip control signal $\overline{CE}^*$ is applied to the gate of the transistor T5. The gate electrodes of the transistors T6 and T7 are connected to the node N1. The output of the inverter INV2 is set such that the transistor T8 is made conductive when the potential at the node N1 is equal to or lower than a second predetermined value. The second predetermined voltage is higher than the first predetermined voltage (e.g., by about 0.1 V) and is equal to the voltage of the bit line $BL_{ij}$ connected to a selected memory cell $MC_{ijk}$ when the memory cell $MC_{ijk}$ is data-written memory cell. The P-channel load transistor T9 is connected between the node N2 and the power source, the gate electrode of which is connected to the node N2.

The potential at the output terminal (node N2) of the bias circuit 10 takes a low level $V_L$ (e.g., about 1 V) when a selected memory cell $MC_{ijk}$ is in a data-erased state, and takes a high level $V_H$ (=Vcc$-|V_{THP}|$) in a data-written state. Here, $V_{THP}$ represents the threshold voltage Of the p-channel transistor T9. The potential at the node N2 is compared with the reference potential at the node N4 in a reference potential generating circuit 60 to be described later. The comparison results are generally outputted via an output buffer circuit (not shown) to the external circuit as the read-out data.

The reference potential generating circuit 60 has a reference cell RMC of the same transistor size as that of a memory cell $MC_{ijk}$, N-channel transistors T11 and T12, and a bias circuit 65. The reference Cell RMC has a gate electrode connected to the power source, a source electrode connected to the ground line, and a drain electrode connected to the bias circuit 65 via the transistors T11 and T12. The transistors T11 and T12 are constructed of the same transistor size as that of the column gate transistors $h_{ik}$ and $g_i$. The bias circuit 65 is constructed the same as the bias circuit 10, except that a P-channel load transistor T10 has a smaller conducting resistance than the transistor T9. Inverters and transistors corresponding to those in the bias circuit 10 are represented by using identical reference symbols. Node N3 in the bias circuit 65 corresponds to the node N1 in the bias circuit 10, and node N4 in the bias circuit 65 corresponds to the node N2 in the bias circuit 65. The potential at the output terminal (node N4) of the bias circuit 65, i.e., the reference potential $V_R$, is set to have an intermediate potential between the high level $V_H$ and low level $V_L$ at the output terminal (node N2) of the bias circuit 10. The difference of the potential at the node N2 and the reference potential $V_R$ are sensed at a current mirror type differential amplifier 30 having P-channel transistors T13, T14 and T15, and N-channel transistors T16 and T17. If the potential at the node N2 is higher than the potential (reference potential $V_R$) at the node N4, the output D* of the differential amplifier 30 has a low potential, and if the former is lower than the latter, the output D* becomes a high potential. The output D* is delivered to an external circuit via an output buffer circuit.

The gate electrode of the transistor T13 of the differential amplifier 30 is supplied with the chip control signal $\overline{CE}^*$.

Figure 2:
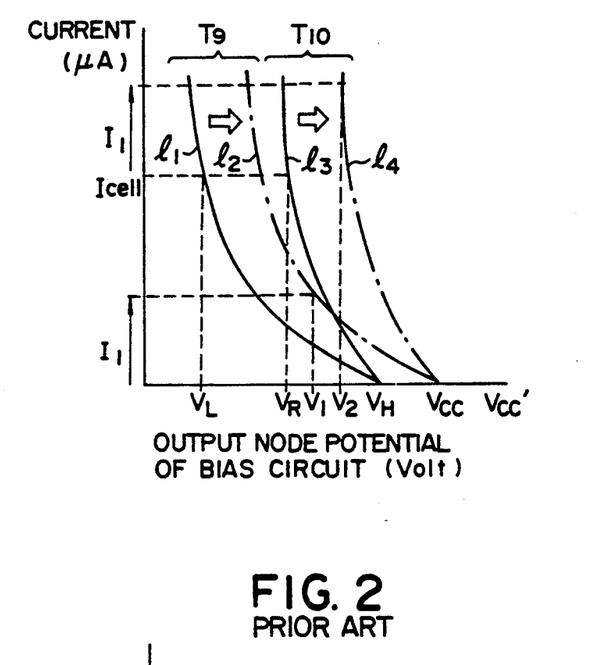
FIG. 2 is a graph showing the relationship between output node potentials and currents flowing through the load transistors, respectively, of the bias circuits of the background art semiconductor memory device shown in FIG. 1.

With the semiconductor memory device constructed as above, according to the background art, there is a problem that an erroneous operation is likely to occur when the power source voltage Vcc fluctuates, because the conducting resistance of the load transistor T9 of the bias circuit 10 is different from that of the load transistor T10 of the bias circuit 65. This will be described with reference to FIGS. 2 and 3. FIG. 2 shows the current flowing through the load transistors T9 and T10 when the drain voltage of each load transistor changes. In FIG. 2, it is assumed that the current I cell flows through a memory cell in the data-erased state. When a selected memory cell is the data-erased memory cell, the potential at the node N2 becomes a low level $V_L$ (refer to line $l_1$) and the potential (reference potential) at the node N4 becomes $V_R$ (refer to line $l_3$). When a selected memory cell is the data-written memory cell, the potential at the node N2 is charged up to a high level $VH_H$, and the current flowing through the transistor T9 becomes 0 μA (refer to line $L_1$). If a selected memory cell is the data-written memory cell, the node N1 and the selected bit line are charged to the second predetermined potential, and the node N2 is charged up to the high level $V_H$ by the load transistor T9.

In this condition, the output potential of the inverter INV2 is the low potential which is higher than the second predetermined potential of the node N1 by the threshold voltage of the transistor T8. If the power source voltage changes in the positive direction relative to the ground potential because of noise components on the power source, the output potential of the inverter INV2 also changes in the positive direction above the predetermined low potential. Therefore, if noise is generated on the power source, the transistor T8 is made conductive also and the node N1 and the bit line are charged up above the second predetermined potential. It is assumed that a current $I_1$ μA flows from the node N2 to the node N1 via the transistor T8 when the noise is generated on the power source.

Since the bias circuit 65 of the reference potential generating circuit 60 has the same circuit structure as the bias circuit 10, the output potential of the inverter INV2 in the bias circuit 65 rises and the transistor T8 in the bias circuit 65 is made conductive, so that the current $I_1$ μA flows from the node N4 to the node N3. The current flowing through the load transistors T9 and T10 when the power source voltage is Vcc' (which is higher than Vcc) are shown by one-dot-chain lines $l_2$ and $l_4$ in FIG. 2. As described previously, when the power source voltage Vcc rises to Vcc' by the noise on the power source, the current $I_1$ μA leaks from the nodes N2 and N4 through the transistors T8 in the bias circuit 10 and 65. As a result, the potential at the node N2 changes from $V_H$ to $V_1$, and the potential at the node N4 changes from $V_R$ to $V_2$ in FIG. 2. Therefore, during the noise generation on the power source, the potential at the node N2 becomes lower than the reference potential at the node N4 so that the output signal D* of the differential amplifier 30 changes from "0" level to "1" level. This level change of the output signal results in an erroneous data output.

Figure 3:
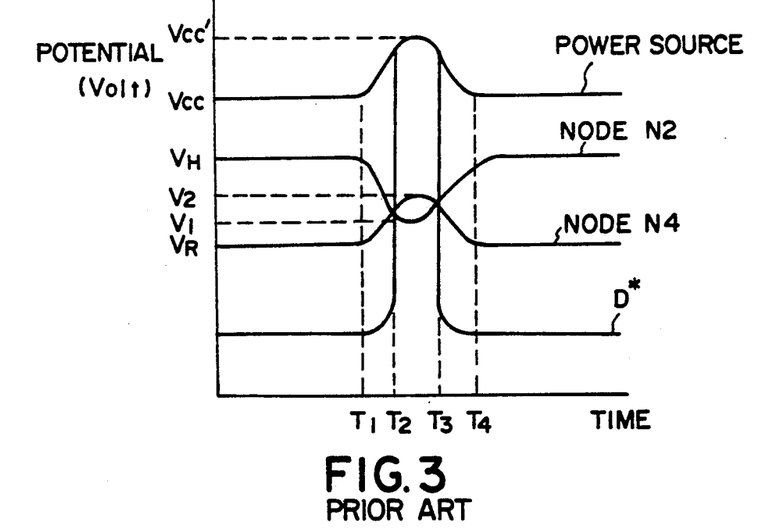
FIG. 3 is a graph showing the potential changes at internal nodes with a power source voltage fluctuation, in the background art semiconductor memory device shown in FIG. 1.

FIG. 3 shows the potential changes with time at respective nodes upon generation of noises on the power source at time $T_1$. The potential of the power source rises to Vcc' at a maximum because of the noise components during the period from time $T_1$ to time $T_4$. Therefore, the potential at the node N2 lowers from $V_H$ to $V_1$, whereas the potential at the node N4 rises from $V_R$ to $V_2$. The potentials at the node N2 is lower than that at the node N4 during the period from time $T_2$ to time $T_3$ so that the output D* of the current mirror type differential amplifier changes from "0" level to "1" level. During this period, erroneous data is outputted to the external circuit.

Figure 4:
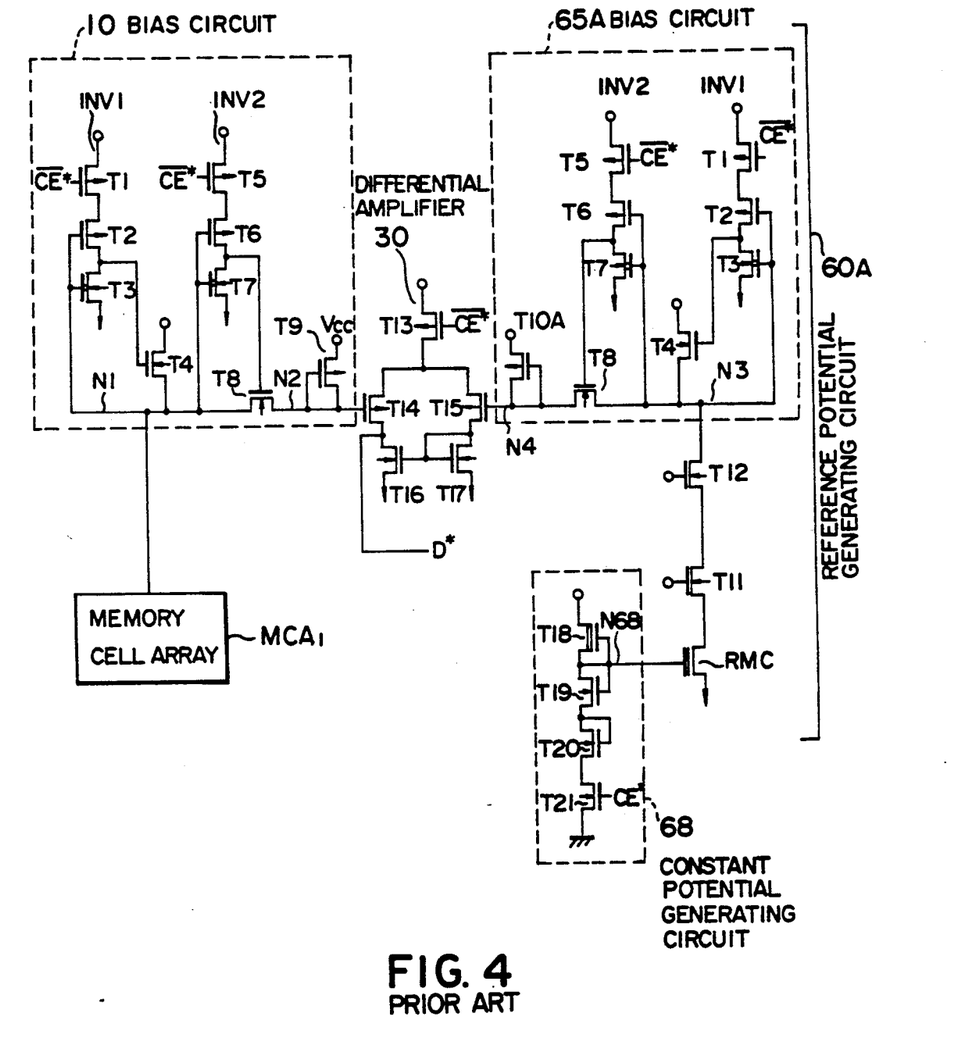
FIG. 4 is a circuit diagram of another background art semiconductor memory device.

Another conventional EPROM is shown in FIG. 4. In this EPROM, the bias circuit 65 of the EPROM shown in FIG. 1 or FIG. 1A is replaced with a bias circuit 65A and the gate electrode of the reference cell RMC is supplied with a constant potential which is generated in a constant potential generating circuit 68.

The bias circuit 65A is obtained by replacing the load transistor T10 of the bias circuit 65 shown in FIG. 1 with a load transistor T10A having the same transistor size as that of the load transistor T9 of the bias circuit 10.

The constant potential generating circuit 68 has serially connected N-channel transistors T18, T19, T20, and T21. Of these transistors, only the transistor T18 is of a depletion type having a negative threshold voltage. The transistor T18 has the drain electrode connected to the power source, and gate and source electrodes connected to the drain and gate electrodes of the transistor T19. The gate electrode of the transistor T20 is connected to the source electrode of the transistor T19, and to the drain electrode of the transistor T20. The gate electrode of the transistor T21 is inputted with an inverted signal CE* of the chip control signal $\overline{CE}^*$, and the source electrode thereof is applied with the ground potential. The output terminal (node N68) of the constant potential generated circuit 68 is connected to the gate electrode of the reference cell RMC.

Figure 5:
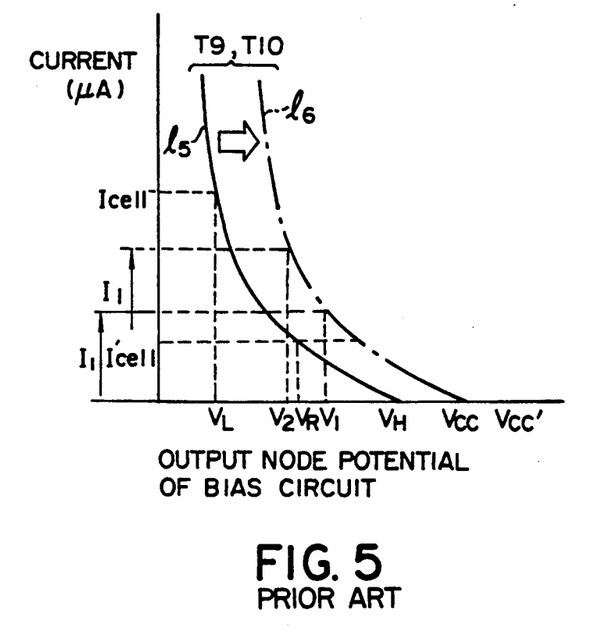
FIG. 5 is a graph showing the relationship between output node potentials and currents flowing through load transistors, respectively of the bias circuits of the background art semiconductor memory device shown in FIG. 4.
Figure 6:
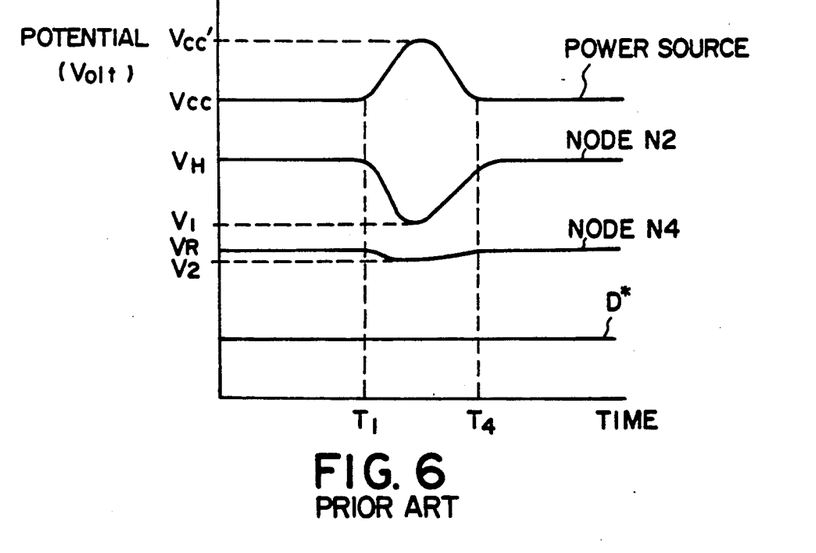
FIG. 6 is a graph showing the potential changes at internal nodes with a power source voltage fluctuation, in the background art semiconductor memory device shown in FIG. 4.

With the EPROM constructed as above, in order to set the level potential at the node N4 at the intermediate potential between the high level $V_H$ and low level $V_L$ at the node N2 of the bias circuit 10, the gate voltage of the reference cell RMC is set at a predetermined voltage below the power source voltage. The load current characteristics flowing through the load transistors T9 and T10A respectively of the bias circuits 10 and 65A are shown in FIG. 5. The load transistors T9 and T10A have the same transistor size so that they provide the same load current characteristics. It is assumed that the potential at the node N4 is the intermediate potential ($V_R$) between the high level $V_H$ and low level $V_L$ at the node N2 when the current flowing through the reference cell RMC is a value Icell', as shown in FIG. 5. The reference cell current may be set at the value Icell' by adjusting the conducting resistance of the transistors T18, T19 and T20. It is therefore possible to set the potential at the node N4 at the intermediate potential $V_R$ between the high level $V_H$ and low level $V_L$ (refer to line $l_5$). If the noise is generated on the power source and the current $I_1$ μA flows from the nodes N2 and N4 to the nodes N1 and N3 respectively, the potentials at the nodes N2 and N4 change to $V_1$ and $V_2$ as shown in FIG. 5 (refer to line $l_6$). In this case, however, the output signal D* of the differential circuit will not change to "1" level because the potential $V_1$ is higher than the potential $V_2$. FIG. 6 shows the potential changes with time at respective nodes of the EPROM shown in FIG. 4. Although the potential of the power source changes during the period from time $T_1$ to time $T_4$, the potential at the node N2 will not become lower than the potential at the node N4. The EPROM therefore will not output any erroneous data.

Figure 7:
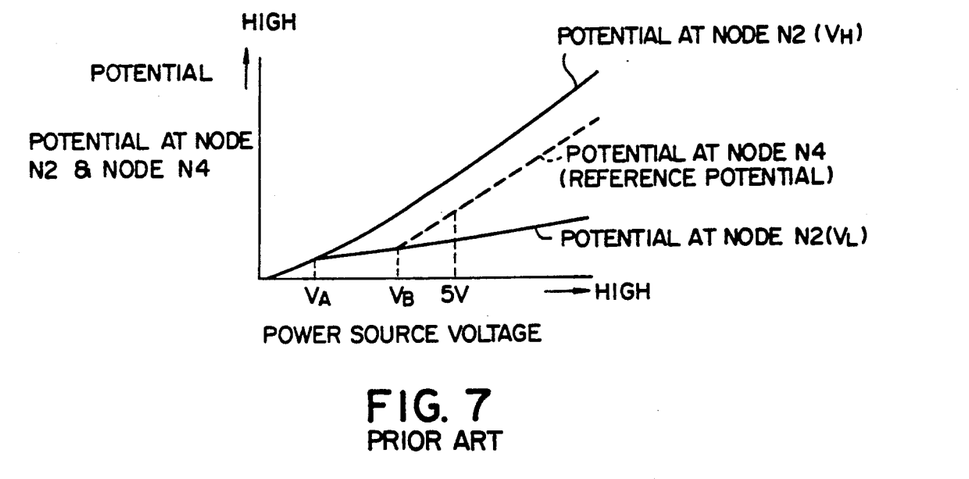
FIG. 7 is a graph showing the power source voltage dependency at internal nodes of the background art semiconductor memory device shown in FIG. 4.

The EPROM shown in FIG. 4 is however associated with a problem that the potential at the node N4 becomes higher than the intermediate potential between $V_H$ and $V_L$ as the potential power source becomes higher. The output potential of the constant potential generating circuit 68 shown in FIG. 4 depends only a little on power source voltage Vcc because the transistor T18 acts as the constant current means. As a result, the power source voltage dependency of the potential at the node N4 has the same inclination as that at the node N2 when a data-written memory cell is selected, as shown in FIG. 7.

Therefore, even if the reference potential is set at the intermediate potential between the high level $V_H$ and low level $V_L$ for the power source voltage of 5 V, the reference potential will become higher than the intermediate potential between the high level $V_H$ and low level $V_L$ if the power source voltage becomes higher than 5 V. In general, the higher the power source voltage becomes, the larger the noises which are generated on the power source line by the switching of an output buffer circuit. It is therefore desirable that the difference between the reference potential and the potential at the node N2 increases as the power source voltage rises. For this reason, the EPROM shown in FIG. 4 has a problem of less noise margin for a higher power source voltage.

Figure 8:
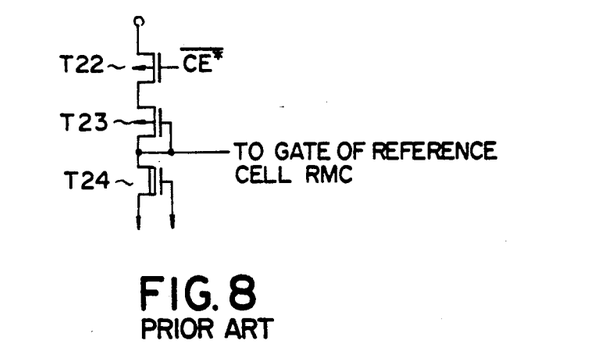
FIG. 8 is a circuit diagram showing another example of the constant potential generating circuit of the background semiconductor memory device shown in FIG. 4.

Another example of the constant potential generating circuit 68 of FIG. 4 is shown in FIG. 8. The constant potential generating circuit shown in FIG. 8 is constructed of serial connected P-channel transistors T22 and T23, and depletion type N-channel transistor T24. The source electrode of the transistor T22 is connected to the power source, and the gate electrode thereof is applied with the chip control signal $\overline{CE}^*$. The gate electrode and drain electrode of the transistor T23 are connected together with the drain electrode of the transistor T24, and the potential at the interconnection node is sent as the output of the constant potential generating circuit to the gate electrode of the reference cell RMC. The gate and source electrodes of the transistor T24 are connected to the ground line. The size of the transistors T23 and T24 of the constant potential generating circuit is determined such that the potential at the node N4 becomes the intermediate potential between the high level $V_H$ and low level $V_L$ at the node N2 of the bias circuit 10.

Figure 9:
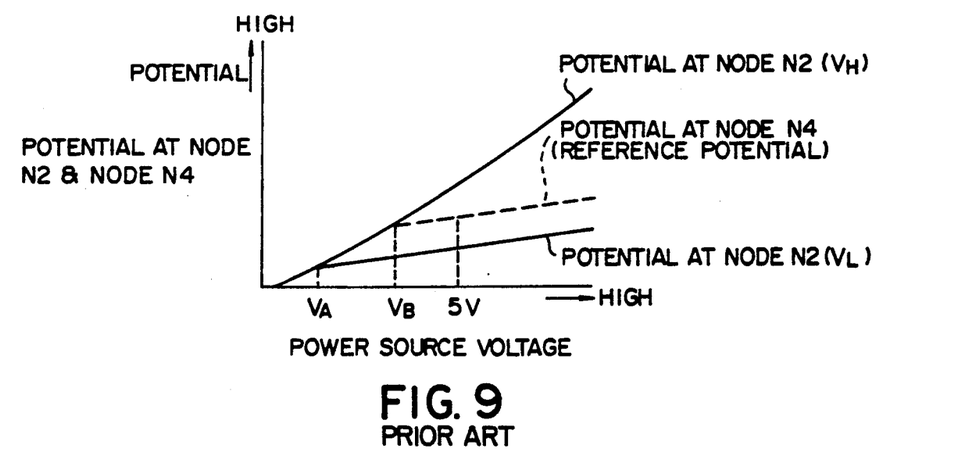
FIG. 9 is a graph showing the power source voltage dependency at internal nodes of a semiconductor memory device using the constant potential generating circuit shown in FIG. 8.

In the EPROM wherein the constant potential generating circuit constructed as above, the potential of the gate electrode of the reference cell RMC becomes higher with a rise of the power source potential. As a result, the potential at the node N4 has the same inclination of the power source voltage dependency at the node N2 when a selected memory cell is in a data-erased state, as shown in FIG. 9. Therefore, even if the reference potential is set at the intermediate potential between the high level $V_H$ and low level $V_L$ for the power source voltage of 5 V, the reference voltage will become lower than the intermediate potential between the high level $V_H$ and low level $V_L$ if the power source voltage becomes higher than 5 V. Similar to the case of the EPROM shown in FIG. 4, there also arises the problem of less noise margin for a higher power source voltage.

SUMMARY OF THE INVENTION

The present invention has been made in consideration of the above problems, and provides semiconductor memory device free from any erroneous operation, even upon fluctuation of a power source voltage over wide range.

According to one aspect of this invention, there is provided a semiconductor memory device comprising: a memory cell for storing at least binary data; a bit line for outputting a voltage corresponding to a storage state of the memory cell when the data stored in the memory cell is read; bit line potential setting means connected between the bit line and a power source for setting the potential of the bit line at a predetermined value in accordance with the storage state of the memory cell; a first reference cell in a storage state equivalent to one of two states of the binary data; a first reference line connected to the drain electrode of the first reference line for outputting a voltage corresponding to a storage state of the reference cell; first reference line potential setting means connected between the first reference line and the power source for setting the potential of the first reference line at a predetermined value; a second reference cell in a storage state equivalent to the first reference cell, the gate electrode of the second reference cell being supplied with the same potential as the gate electrode potential of the memory cell; a second reference line connected to the drain electrode of the second reference cell for outputting a voltage corresponding to a storage state of the second reference cell; a second reference line potential setting means connected between the second reference line and the power source for setting the potential of the second reference line at a predetermined value; gate voltage supplying means for comparing the potential at the first reference line with the potential at the second reference line and controlling the gate voltage of the first reference cell so as to make the first and second reference line potentials have the same power source voltage dependency; and data detecting means for comparing the voltages at the bit line and the first reference line and reading the data stored in the memory cell.

According to another aspect of the present invention, there is provided a semiconductor memory device comprising: a memory cell array having a plurality of memory cells disposed in a matrix; word lines for selectively driving some of memory cells in the memory cell array; a bit line for receiving data from one of the memory cells selectively driven by one of the word lines; a first transfer gate transistor one end of whose current path is connected to the bit line; a first load circuit whose current path is connected between the other end of the current path of the first transfer gate and a power source; a first reference cell; a second transfer gate transistor one end of whose current path is connected to the drain electrode of the first reference cell; a second load circuit whose current path is connected between the other end of the second transfer gate transistor and the power source; a second reference cell whose gate electrode is supplied with a voltage equal to that at the selected word line; a third transfer gate transistor one end of whose current path is connected to the gate electrode of the second reference cell; a third load circuit whose current path is connected between the other end of the current path of the third transfer gate transistor and the power source; control means for controlling the voltage applied to the gate electrode of the first reference cell so as to make the voltage at the other end of the current path of the second transfer gate transistor equal to the voltage at the other end of the current path of the third transfer gate transistor; and data detecting means for comparing the potential at the other end of the current path of the first transfer gate transistor with the potential at the other end of the current path of the second transfer gate transistor and detecting a storage data in the selectively driven memory cell.

According to a still further aspect of this invention, there is provided a semiconductor memory device comprising: a memory cell array having a plurality of memory cells disposed in matrix; word lines for selectively driving some of memory cells in the memory cell array; a bit line for receiving a data from one of the memory cells selectively driven by one of the word lines; a first load circuit whose current path is connected between the bit line and a power source; a reference cell; a reference line for outputting a voltage corresponding to a storage state at the reference cell; a second load circuit whose current path is connected to the reference line and the power source; control means for controlling a voltage applied to the gate electrode of the reference cell; and data detecting means for comparing the voltage at the bit line with the voltage at the reference line and detecting the data stored in the memory cell; wherein when a load circuit having the conducting resistance smaller than that of the first load circuit, control means controls the gate voltage of the reference cell so as to make the voltage appearing on the bit line at the time when the memory cell is in a conductive state have the same power source potential dependency as that of the voltage appearing on the reference line.

DESCRIPTION OF THE PREFERRED EMBODIMENTS

Figure 10:
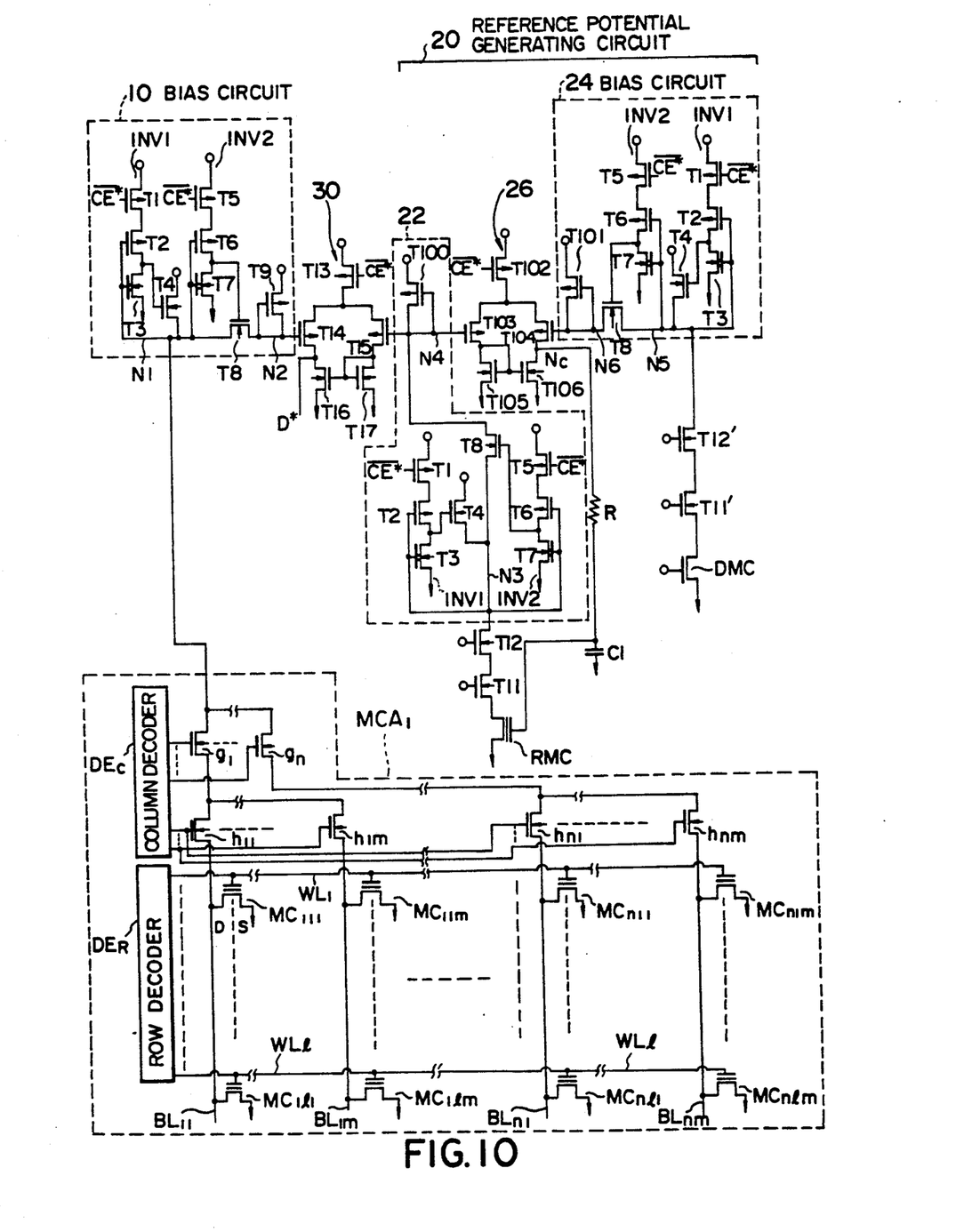
FIGS. 10 and 10A are circuit diagrams of semiconductor memory devices according to the present invention.

A first embodiment of the semiconductor memory device according to this invention is shown in FIG. 10. In this embodiment of a semiconductor memory device, the reference potential generating circuit 60 of the semiconductor memory device shown in FIG. 1 is replaced with a reference potential generating circuit 20. The other circuit arrangements are the same as FIG. 1, and like elements to those shown in FIG. 1 are represented by identical reference symbols. This reference potential generating circuit 20 has bias circuits 22 and 24, differential amplifier 26, N-channel transistors T11, T12, T11', and T12', first reference cell RMC, and second reference cell DMC.

In the bias circuit 22, the load transistor T10 of the bias circuit 65 shown in FIG. 1 is replaced with a P-channel load transistor T100, and the node N4 is connected to the gate electrode of a transistor T15 of the differential amplifier 30. This bias circuit 22 supplies a bias potential to the reference cell RMC which is connected to a node N3 via the transistors T11 and T12. The bias circuit 24 has the same circuit arrangement as the bias circuit 22, except that the load transistor T100 of the bias circuit 22 is replaced with a P-channel load transistor T101. Nodes of the bias circuit 24 corresponding to the nodes N3 and N4 are represented by N5 and N6, respectively. The differential amplifier 26 is constructed as a current mirror type differential amplifier having P-channel transistors T102, T103 and T104, and N-channel transistors T105 and T106. In the differential amplifier 26, the transistor T102 has a gate electrode applied with the chip control signal $\overline{CE}^*$, a source electrode connected to the power source, and a drain electrode connected to the source electrodes of the transistors T103 and T104. The transistor T103 has a gate electrode connected to the node N4 of the bias circuit 22, a drain electrode connected to the drain and gate electrodes of the transistor T105 and to the gate electrode of the transistor T106. The transistor T104 has a gate electrode connected to the node N6 of the bias circuit 24, and a drain electrode connected to the drain electrode of the transistor T106. The source electrodes of the transistors T105 and T106 are connected to the ground line. The differential amplifier 26 compares the output potential of the bias circuit 22 at the node N4 with the output potential of the bias circuit 24 at the node N6, and controls the conductance of the first reference cell RMC.

The second reference cell DMC has the same structure and transistor size as those of the memory cell $MC_{ijk}$. The source electrode of the second reference Cell DMC is connected to the ground line, the gate electrode of the second reference cell DMC is connected to the power source, and the drain electrode of the second reference cell DMC is connected to the node N5 of the bias circuit 24 via the transistors T11' and T12' which are equivalent to the column gate transistors $h_{ik}$ and $g_i$ respectively.

Similar to the second reference cell DMC, the first reference cell RMC also has the same structure and transistor size as those of the memory cell $MC_{ijk}$. The source electrode of the first reference cell RMC is connected to the ground line, the gate electrode of the first reference cell RMC is connected to a node Nc which is connection node between the transistors T104 and T106 of the differential amplifier 26, and the drain electrode of the first reference cell RMC is connected to the node N3 of the bias circuit 22 via the transistors T11 and T12 which are equivalent to the column gate transistors $h_{ik}$ and $g_i$.

Next the operation of the reference potential generating circuit 20 will be described. The size of the load transistor T101 of the bias circuit 24 is set such that the potential at the node N6 takes an intermediate potential between the high level $V_H$ and low level $V_L$ at the node N2 of the bias circuit 10. The size of the load transistor T100 of the bias circuit 22 is set at substantially the same size as of the load transistor T9 of the bias circuit 10.

Figure 11:
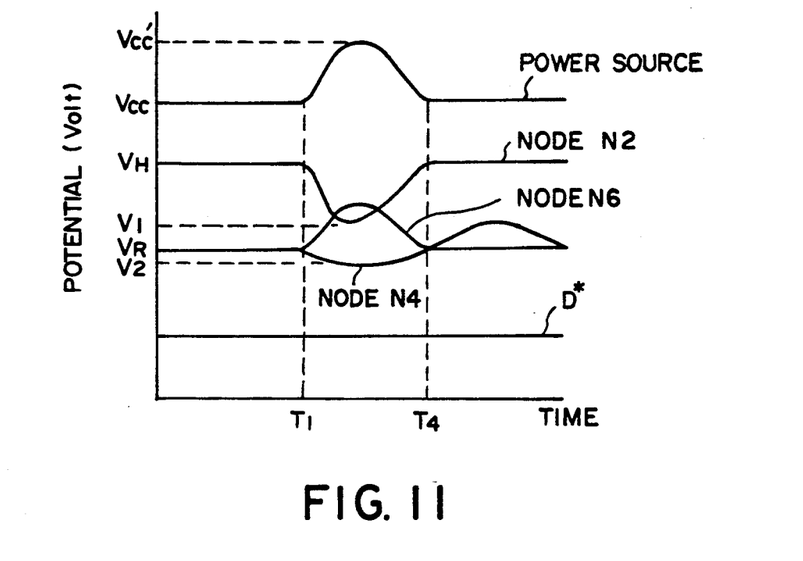
FIG. 11 is a graph showing the potential changes at internal nodes with a power source voltage fluctuation of the embodiment shown in FIG. 10.

If the potential at the output node N4 of the bias circuit 22 becomes higher than that at the node N6, the output potential (at node Nc) rises, and the current flowing through the reference cell RMC increases. As a result, the potential at the output node N4 of the bias circuit 22 becomes low and then the potential (at the output node Nc) of the differential circuit 26 becomes low. Therefore, the potential at the output node N4 of the bias circuit 22 eventually becomes equal to the potential at the output node N6 of the bias circuit 24. The potential at the node N6 of the bias circuit 24 is set at an intermediate level $V_R$ between the high level $V_H$ and low level $V_L$ at the output node N2 of the bias circuit 10. The potential at the output node N4 of the reference potential generating circuit 20 therefore becomes equal to the intermediate potential $V_R$ between the high level $V_H$ and low level $V_L$ at the output node N2 of the bias circuit 10. When noises are generated on the power source, the potential change at the internal nodes of the reference potential generating circuit 20 will be described. FIG. 11 shows the potential changes with time at the nodes N2, N4 and N6 upon generation of noises on the power source. When the power source voltage Vcc changes to Vcc' at a maximum during the period from time $T_1$ to time $T_4$, the potential at the node N6 rises from $V_R$ as shown in FIG. 11, in a similar manner at the node N4 of the reference potential generating circuit 60 of the EPROM shown in FIG. 1. Although the potential change at the node N6 is detected with the differential amplifier 26. The gate voltage of the first reference cell RMC remains at a constant value during a predetermined delay time, owing to the resistance R connected between the node Nc and the gate of the first reference cell and the capacitance C1 which is connected to the gate of the first reference cell. If the predetermined delay time is longer than the time during which noises are generated on the power source, the potential at the node N4 of the bias circuit 22 falls as shown in FIG. 11 (after time T1), in the similar manner at the node N4 of the reference potential generating circuit 65A of the EPROM shown in FIG. 4 (refer to FIG. 6). Because the gate voltage of the first reference cell falls after the predetermined delay time, the potential at the node N4 starts rising after time T4 as shown in FIG. 11. Even if the potential at the node N4 rises after time T4, however, the potential at the node N2 is higher than that at the node N4 as shown in FIG. 11. Therefore, the output D of the differential amplifier 30 remains at the "0" level without inverting the data to be outputted via an output buffer circuit to an external circuit. As appreciated from the foregoing description, according to this embodiment, even if the power source voltage fluctuates, the potential at the output node N2 of the bias circuit 10 is higher than the reference potential, thereby preventing an output of an erroneous data different from the memory cell data.

If the delay time required for changing the potential of the node N4 in response to the change of the gate potential of the first reference cell RMC is longer than the time while noises are generated on the power source, it is not necessary to connect the resistor R and the capacitor C1 between the output node (Nc) and the gate electrode of the reference cell RMC.

Figure 12:
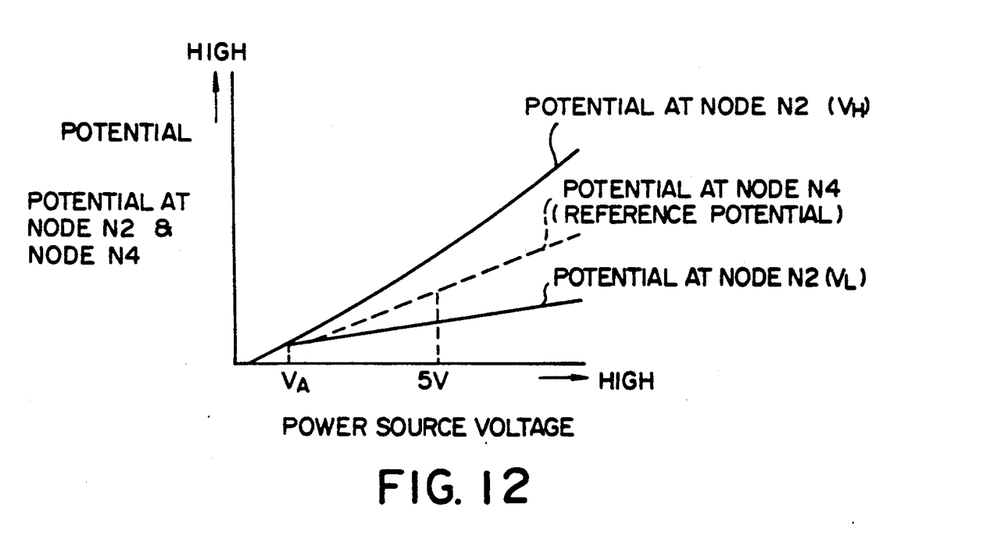
FIG. 12 is a graph showing the power source voltage dependency at internal nodes of the embodiment shown in FIG. 10.

FIG. 12 shows the power source voltage dependency at the nodes N2 and N4 in the semiconductor memory device of this embodiment. As described previously, according to this embodiment, the current flowing through the second reference cell DMC is set equal to the current amount flowing through a selected memory cell $MC_{ijk}$ in a data-erased state. The conducting resistance of the load transistor T101 is made small so that the potential at the node N6 is set at the intermediate potential between the high level $V_H$ and low level $V_L$ at the node N2.

With such an arrangement, even if the power source voltage rises, the potential at the output node N6 of the bias circuit 24 remains at the intermediate potential between the high level $V_H$ and low level $V_L$ at the output node N2 of the bias circuit 10 in the similar manner at the node N4 of the reference potential generating circuit 60 of the EPROM shown in FIG. 1. The conductance of the reference cell RMC is controlled by an output signal from the differential amplifier 26 so that the potential at the output node N4 of the bias circuit 22 becomes equal to the potential at the node N6. Therefore, even if the power source voltage becomes higher than 5 V as shown in FIG. 12, the potential at the output node N4 remains equal to the intermediate potential between the high level $V_H$ and low level $V_L$ at the output node N2 of the bias circuit 10. According to this embodiment, the potential difference between the reference potential and that at the node N2 of the bias circuit 10 increases with the increase of the power source voltage. Therefore, even if noises generated by switching of the output level of an output buffer circuit becomes larger, with the increase of the power source voltage, the output of erroneous data does not occur.

Next, the description will be given for the case where the power source voltage is lower than 5 V.

The theoretical minimum power source voltage (Vccmin) at which a data in a memory cell $MC_{ijk}$ can be read, is a voltage where $V_H$ or $V_L$ and the voltage at the node N4 becomes equal to each other as shown in FIGS. 7 and 9 as $V_B$ for the semiconductor memory device shown in FIGS. 4 and 8. The Vccmin ($V_B$) is higher by more than 1 V than in the power source voltage $V_A$ where the high level $V_H$ and the low level $V_L$ becomes equal to each other, as shown in FIGS. 7 and 9. However, in this embodiment, Vccmin is approximately equal to $V_A$ as shown in FIG. 12. It is possible therefore to have a wide range of the power source voltages within which a data can be read from the semiconductor memory device of this embodiment.

In the embodiment shown in FIG. 10, the resistor R and capacitor $C_1$ defining the time constant $\tau$ are connected to the output of the differential amplifier 26, to suppress any quick change of the current flowing through the first reference cell RMC when the noises are generated on the power supply. A capacitor may be connected to the node N3 of the bias circuit 22 instead of the resistor R and capacitor $C_1$ so that even if the current flowing through the reference cell RMC changes, the potential at the node N3 of the bias circuit 22 does not change rapidly. As a result, the potential rise at the node N4 may be suppressed for a predetermined period.

Figure 10A:
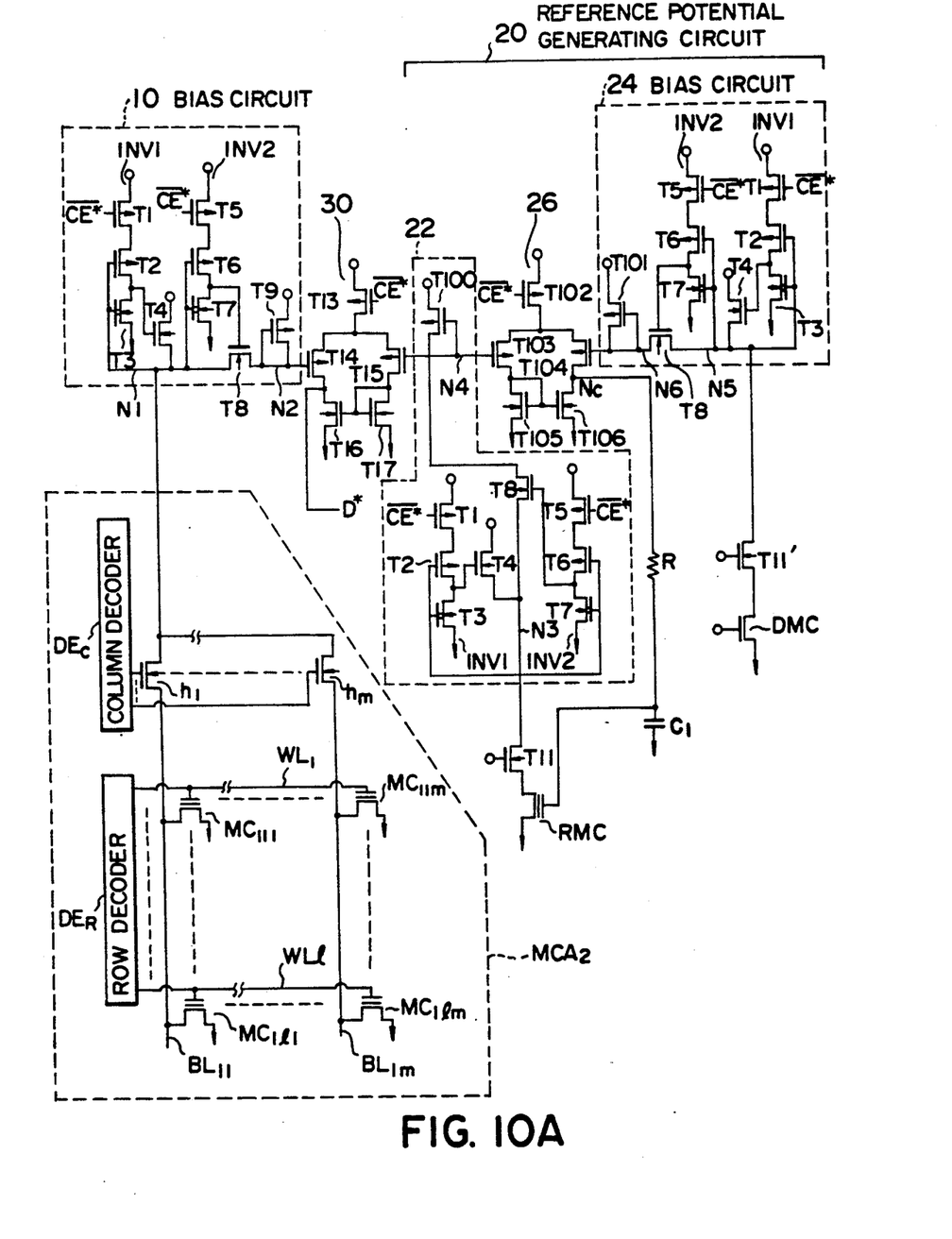

FIG. 10A shows a device having a memory cell array $MCA_2$ without the column gate transistor $g_i$. The other constructions shown in FIG. 10A are similar to those shown in FIG. 10.

Figure 13:
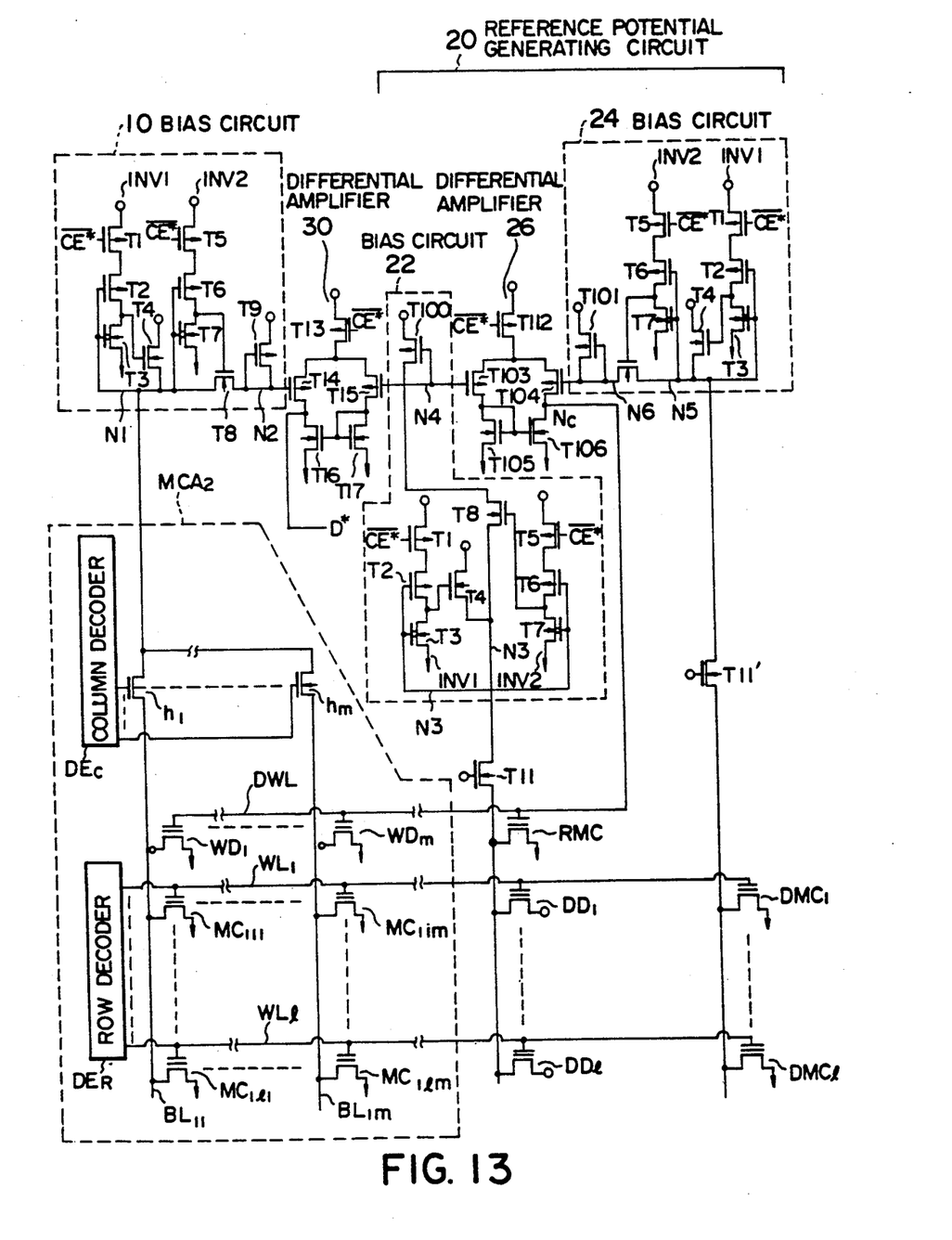
FIG. 13 is a circuit diagram showing another embodiment of the semiconductor memory device according to the present invention.

FIG. 13 shows the second embodiment of the semiconductor memory device of this invention. In this embodiment semiconductor memory device, the second reference cell DMC of the semiconductor memory device shown in FIG. 10A is replaced with a plurality of second reference cells $DMC_j$ (j=1, ..., l) connected to second reference line, the resistor R and capacitor $C_1$ are replaced with a dummy word line DWL and m dummy capacitor cells $WD_k$ (k=1, ..., m), while l dummy capacitor cells $DD_j$ (j=1, ..., l) are newly added. The drain electrode of each second reference cell $DMC_j$ is connected via the transistor T11' to the node N5 of the bias circuit 24. The gate electrode of each second reference cell $DMC_j$ is connected to the corresponding word line $WL_j$, and the source electrode thereof is connected to the ground line. Similar to the drain electrode of the first reference cell RMC, the drain electrode of each dummy capacitor cell $DD_j$ is connected to the node N3 of the bias circuit 22 via the transistor T11, and the gate electrode of each dummy capacitor cell $DD_j$ is connected to the corresponding word line $WL_j$. The source electrode of each dummy capacitor cell $DD_j$ however is not connected to the ground line but is maintained in a floating state. Similar to the gate electrode of the first reference cell RMC, the gate electrode of each dummy capacity cell $WD_k$ (k=1, ..., m) is connected to the output terminal Nc of the differential amplifier 26 via the dummy word line DWL, and the source electrode of each dummy capacitor cell $WK_k$ is connected to the ground line. The drain electrode thereof, however, is maintained in a floating state.

With the semiconductor memory device of this embodiment, only one, second reference cell $DMC_j$ becomes conductive. Its gate electrode is connected to the word line $WL_j$ selected in accordance with a row address. The other second reference cells $DMC_h$ (h≠j) become non-conductive. The current flowing through the second reference cell $DMC_j$ via the transistor T11' therefore becomes equal to that flowing through the single second reference cell DMC of the embodiment shown in FIG. 10A. Accordingly, the potential at the node N6 of the bias circuit 24 is equal to that at the node N6 of the bias circuit 24 of the embodiment shown in FIG. 10A. In addition, since the dummy capacitor cell $DD_j$ (j=1, ..., l) is connected to the drain electrode of the first reference cell RMC, the potential at the node N3 of the bias circuit 22 does not change quickly even if the current flowing through the first reference cell RMC changes. In other words, it is possible to obtain the same advantageous effect as where a capacitor $C_1$ is connected to the node N3 of the bias circuit 22 of the embodiment shown in FIG. 10A. In place of the dummy capacitor cell $DD_j$ with its source electrode being in a floating state, a cell having a high threshold voltage and its source electrode being connected to the ground line may be used with the same advantageous effects.

The gate electrodes of dummy capacitor cells $WD_k$ (k=1, ..., m) are connected via the dummy word line DWL to the output terminal Nc of the differential amplifier 26. Therefore, the potential at the gate electrode of the first reference cell RMC does not change quickly even if the potential at the node Nc changes, and it is possible to have the same advantageous effects as the semiconductor memory device of the embodiment shown in FIG. 10A. In place of the dummy capacitor cell $WD_k$, a dummy capacitor cell having a high threshold voltage and its drain electrode connected to the bit line $BL_j$ may be used.

The first reference cell RMC and l second reference cells $DMC_j$ (j=1, ..., l) may be fabricated within the memory cell array so that the variations of channel width and length, to be caused by manufacturing processes, of the second reference cells $DMC_j$, and reference cell RMC can be made the same as those of other memory cells such as $MC_{111}$ to $MC_{1lm}$ within the memory cell array. It is possible therefore to have a large process margin.

In FIG. 13, the device is shown as not having transistors $g_l$ to $g_m$ selected by the column decoder $DE_c$. The semiconductor memory device having the transistors $g_l$ to $g_m$ and those cells $DMC_j$, $DD_j$, and $WD_k$ can also be realized.

Figure 14:
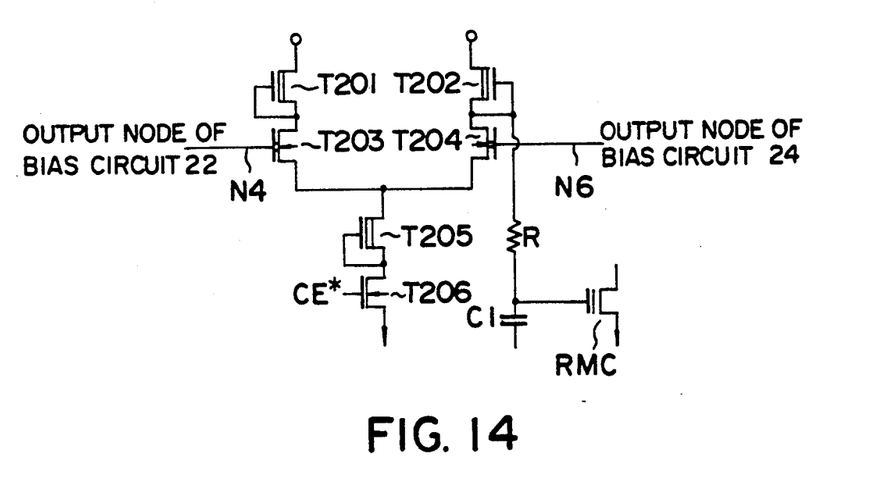
FIG. 14 is a circuit diagram showing another example of a differential amplifier according to the present invention.

Another example of the differential amplifier 26 of the semiconductor memory devices shown in FIGS. 10 and 10A is shown in FIG. 14. The differential amplifier shown in FIG. 14 has depletion type N-channel transistors T201, T202 and T205 having a negative threshold voltage, N-channel transistors T203 and T204 having a threshold voltage near 0 V, and an N-channel transistor T206. The gate electrode of the transistor T203 is connected to the node N4 of the bias circuit 22 of the embodiments shown in FIGS. 10 and 10A, and the gate electrode of the transistor T204 is connected to the node N6 of the bias circuit 24 of the embodiments shown in FIGS. 10 and 10A. The gate electrode of the transistor T202 is connected via a resistor R to the gate electrode of the first reference cell of the embodiments of FIGS. 10 and 10A. The differential amplifier having such a circuit arrangement can be applied to the device when constructed with only n-channel transistors.

Instead of the differential amplifier 26, other types of differential amplifiers, generally known as an input voltage difference detection type differential amplifiers may also be used within the scope of this invention. The reference cells of the reference potential generating circuit 20 have the same structure and transistor size as the memory cells. Therefore, even if the conductance and threshold voltage of the memory cells change during the manufacturing process, the reference cell change to the same degree. Furthermore, the bias circuits for biasing the reference cell(s) are a duplicate of the bias circuit for the memory cells, so that even if the conductance and threshold voltage of transistors of the embodiments change during the manufacturing process, the semiconductor memory device advantageously operates in a stable manner. It is obvious that if the reference potential generating circuit as described with the embodiments is used, the same advantageous effects can be obtained irrespective of the memory cell array structure, bias circuit arrangement, and differential amplifier 30 which are different from those described with the embodiments.

What is claimed is:

1. A semiconductor memory device comprising:
 a memory cell having a drain, a gate and a source, said source of said memory cell being connected to a ground line, said gate of said memory cell being supplied with a predetermined potential for reading memory cell data;
 a bit line connected to said drain of said memory cell for receiving said memory cell data;
 a bit line potential setting means connected between said bit line and a memory cell data detecting terminal for setting a potential value of said bit line lower than that of a power source line;
 a load transistor connected between said memory cell data detecting terminal and said power source line;
 a first reference cell having a drain, a gate and a source, said gate of said first reference cell having applied thereto said predetermined potential, said source of said first reference cell being connected to said ground line;
 a first reference line connected to said drain of said first reference cell for receiving first reference cell data;
 first reference line potential setting means connected between said first reference line and a first reference cell data detecting terminal for setting a potential value of said first reference line lower than that of said power source line;
 a first reference load transistor connected between said first reference cell data detecting terminal and said power source line, said first reference load transistor having a lower conductance value than that of said load transistor;
 a second reference cell having a drain, a gate and a source, said source of said second reference cell being connected to said ground line;
 a second reference line connected to said drain of said second reference cell for receiving second reference cell data;
 second reference line potential setting means connected between said second reference line and a second reference cell data detecting terminal for setting a potential value of said second reference line lower than that of said power source line;
 a second reference load transistor connected between said second reference data detecting terminal and said power source line, said second reference load transistor having a conductance value equal to that of said load transistor;
 gate potential generating means having an output terminal connected to said gate of said second reference cell for controlling a gate potential of said second reference cell, so as to make a potential value at said first reference cell data detecting terminal equal to the potential value at said second reference cell data detecting terminal; and
 data detecting means for reading out said memory cell data in accordance with a comparison result between a potential value at said memory cell data detecting terminal and said potential value at said second reference cell data detecting terminal.

2. A semiconductor memory device according to claim 1, wherein said second reference line potential setting means is a duplicate circuit of said bit line potential setting means.

3. A semiconductor memory device according to claim 1, wherein a delay means is provided between said output terminal of said gate potential generating means and said gate of said second reference cell.

4. A semiconductor memory device comprising:
 a memory cell having a drain, a gate and a source, said source of said memory cell being connected to a ground line, said gate of said memory cell having applied thereto a predetermined potential for reading out a memory cell data;
 a bit line connected to said drain of said memory cell for receiving said memory cell data;
 a bit line potential setting means connected between said bit line and a memory cell data detecting terminal for setting a potential value of said bit line lower than that of a power source line;
 a load transistor connected between said memory cell data detecting terminal and said power source line;
 a reference cell having a drain, a gate and a source, said source of said reference cell being connected to said ground line;
 a reference line connected to said drain of said first reference cell for receiving reference cell data;
 reference line potential setting means connected between said reference line and a reference cell data detecting terminal for setting a potential value of said reference line lower than that of said power source line;
 a reference load transistor connected between said reference cell data detecting terminal and said power source line, said reference load transistor having a conductance value which is equal to that of said load transistor;
 potential generating means for generating a comparison potential having a value which is lower than a potential value at said memory cell data detecting terminal when said memory cell is in a nonconductive state, and which is higher than a potential value at said memory cell data detecting terminal when said memory cell is in a conductive state;
 potential comparing means having an output terminal connected to said gate of said reference cell for controlling a current flowing through said reference cell so as o make a potential value at said reference cell data detecting terminal equal to said comparison potential value;
 a delay means connected between said output terminal of said potential comparing means and said gate of said reference cell; and
 data detecting means for comparing a potential at said memory cell data detecting terminal with a potential at said reference cell data detecting terminal to detect said memory cell data.

5. A semiconductor memory device comprising:
 a memory cell array having a plurality of memory cell transistors disposed in a matrix;
 word lines for selectively applying a predetermined potential to the gates of selected memory cell transistors in said memory cell array;

a bit line connected to said drains of said memory cell transistors for receiving selected memory cell data;

bit line potential setting means connected between said bit line and a memory cell data detecting terminal for setting a potential value of said bit line lower than that of a power source line;

a load transistor connected between said memory cell data detecting terminal and said power source line;

a reference cell having a drain, a gate and a source said source of said reference cell being connected to a ground line;

a reference line connected to said drain of said first reference cell for receiving reference cell data;

a reference line potential setting means connected between said reference line and a reference cell data detecting terminal for setting a potential value of said reference line lower than that of said power source line;

a reference load transistor connected between said reference cell data detecting terminal and said power source line, said reference load transistor having a conductance value equal tot hat of said load transistor;

potential generating means for generating a comparison potential having a value low than a potential value at said memory cell data detecting terminal when said memory cell is in a nonconductive state, ad which is higher than a potential value at said memory cell data detecting terminal when said memory cell is a conductive state;

potential comparing means, having an output terminal connected to said gate of said reference cell, for controlling the current flowing through said reference cell, so as to make a potential value at said reference cell data detecting terminal equal to said comparison potential value;

a delay means connected between said output terminal and said gate of said reference cell; and data detecting means for comparing a potential at said memory cell data detecting terminal with a potential at reference cell data detecting terminal to detect said memory cell data.

6. A semiconductor memory device according to claim 5, wherein the delay mean is formed by a dummy work line connected to the gates of the dummy cell transistors disposed within said memory cell array.

7. A semiconductor memory device according to claim 6, wherein said potential generating means comprises:

a dummy cell having a drain, a gate and a source, said source of said dummy cell being connected to said ground line, said gate of said dummy cell having applied thereto said predetermined potential;

drain potential setting means connected between said drain of said dummy cell and a comparison potential outputting terminal, for setting a potential value of said drain of said dummy cell lower than that of said power source line; and a dummy cell load transistor connected between said comparison potential outputting terminal and said power source line, said dummy cell load transistor having a conductance value equal to that of said load transistor.

8. A semiconductor memory device according to claim 7, wherein said dummy cell is selected by a selected word line.

* * * * *